United States Patent
Williams et al.

(10) Patent No.: US 7,279,917 B2
(45) Date of Patent: Oct. 9, 2007

(54) STACKED TIP CANTILEVER ELECTRICAL CONNECTOR

(75) Inventors: Scott R. Williams, Saint George, UT (US); John M. Shuhart, Warminster, PA (US); Alan Slopey, Warrington, PA (US); Guy B. Frick, Maple Glen, PA (US)

(73) Assignee: SV Probe Pte Ltd., Singapore (SG)

( * ) Notice: Subject to any disclaimer, the term of this patent is extended or adjusted under 35 U.S.C. 154(b) by 0 days.

(21) Appl. No.: 11/211,994

(22) Filed: Aug. 25, 2005

(65) Prior Publication Data

US 2006/0043995 A1   Mar. 2, 2006

Related U.S. Application Data

(60) Provisional application No. 60/604,561, filed on Aug. 26, 2004.

(51) Int. Cl.
*G01R 31/02* (2006.01)
(52) U.S. Cl. .............................. 324/762; 324/754
(58) Field of Classification Search .............. None
See application file for complete search history.

(56) References Cited

U.S. PATENT DOCUMENTS

| | | | |
|---|---|---|---|
| 5,177,438 A * | 1/1993 | Littlebury et al. | 324/754 |
| 5,892,223 A | 4/1999 | Karpov et al. | |
| 6,255,126 B1 | 7/2001 | Mathieu et al. | |
| 6,359,455 B1 * | 3/2002 | Takekoshi | 324/754 |
| 6,388,461 B2 * | 5/2002 | Fukasawa et al. | 324/765 |
| 6,507,204 B1 * | 1/2003 | Kanamaru et al. | 324/754 |
| 6,520,778 B1 * | 2/2003 | Eldridge et al. | 439/66 |
| 6,672,875 B1 * | 1/2004 | Mathieu et al. | 439/66 |
| 6,771,084 B2 * | 8/2004 | Di Stefano | 324/754 |
| 6,870,381 B2 * | 3/2005 | Grube | 324/754 |
| 6,960,518 B1 * | 11/2005 | Tsao et al. | 438/616 |
| 6,970,005 B2 * | 11/2005 | Rincon et al. | 324/754 |
| 7,081,624 B2 * | 7/2006 | Liu et al. | 250/306 |
| 2001/0054907 A1 | 12/2001 | Beaman et al. | |
| 2002/0008530 A1 * | 1/2002 | Kim et al. | 324/754 |
| 2002/0105076 A1 * | 8/2002 | Lin | 257/738 |
| 2003/0132027 A1 | 7/2003 | Maruyama et al. | |
| 2007/0089551 A1 * | 4/2007 | Williams et al. | 73/866.5 |

FOREIGN PATENT DOCUMENTS

JP   9-274066   10/1997
JP   10-253642   9/1998

* cited by examiner

*Primary Examiner*—Ha Tran Nguyen
*Assistant Examiner*—Richard Isla-Rodas
(74) *Attorney, Agent, or Firm*—Hickman Palermo Truong & Becker LLP; Edward A. Becker

(57) ABSTRACT

A probe for a probe card assembly is provided. The probe includes a beam element having a tip end portion. The probe also includes a tip structure on the tip end portion of the beam element. The tip structure includes a plurality of conductive bumps arranged in a stacked configuration.

12 Claims, 9 Drawing Sheets

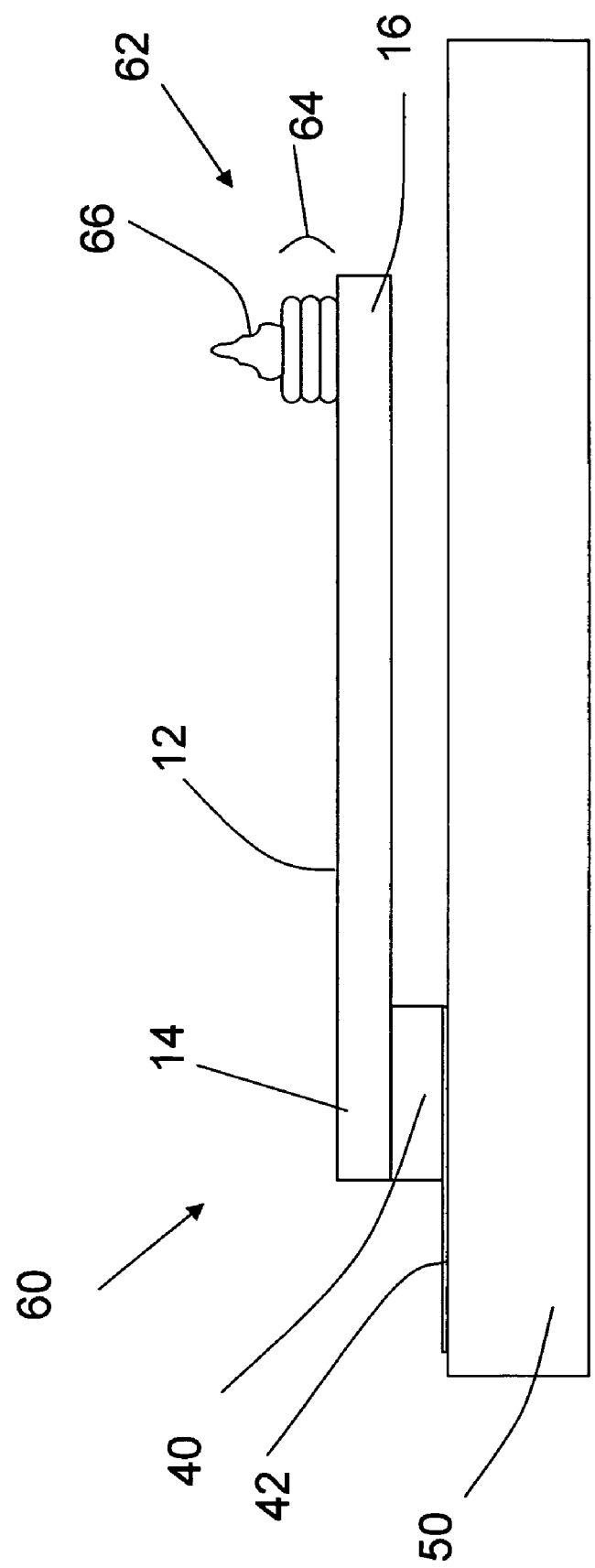

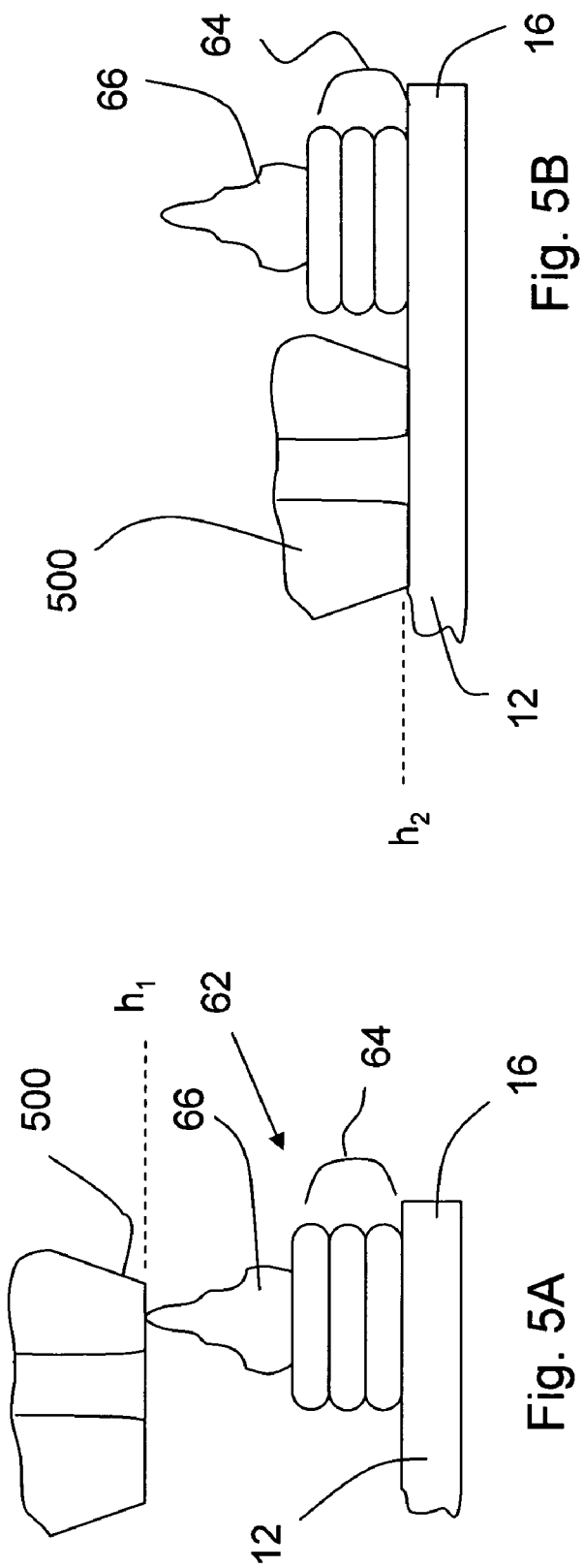
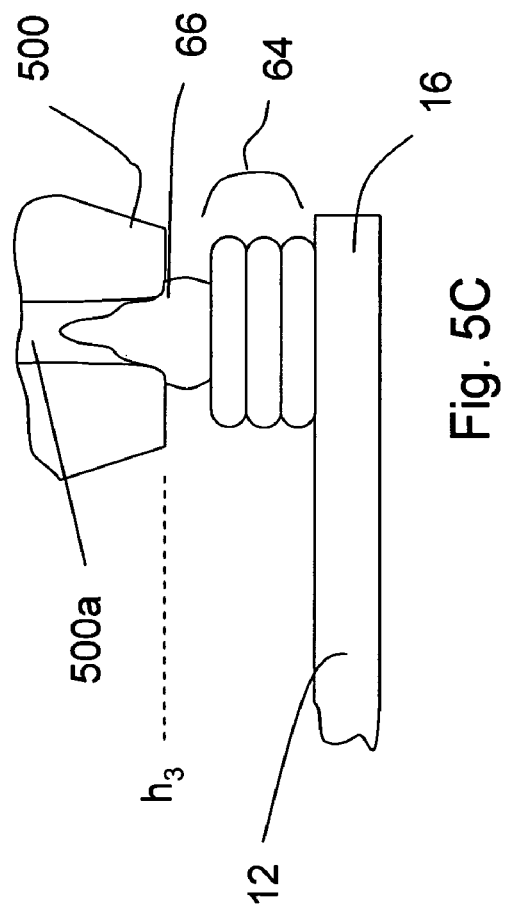

US 7,279,917 B2

STACKED TIP CANTILEVER ELECTRICAL CONNECTOR

RELATED APPLICATION

The present application is related to and claims priority from U.S. Provisional Patent Application Ser. No. 60/604,561, filed Aug. 26, 2004, which is incorporated herein by reference in its entirety.

FIELD OF THE INVENTION

The present invention relates to equipment for testing of integrated circuits. More particularly, the present invention relates to probe elements of a probe card assembly for wafer testing of integrated circuits.

BACKGROUND OF THE INVENTION

Cantilever electrical connector elements are widely used in the manufacture of probe cards for testing (e.g., wafer testing) integrated circuits and similar items. A cantilever electrical connector is designed so as to provide electrical contact between an electrical contact point (e.g., a contact pad) on the device under test (DUT) and another electrical contact point (e.g., another contact pad) on a testing apparatus. Thus, the cantilever electrical connector provides a portion of an electrical path in a probe card assembly, where the probe card assembly provides the electrical interconnection between a DUT and a testing apparatus.

The end of the cantilever electrical connector that comes into contact with the contact pad on the DUT generally is formed with a contact pad that is made from a material and with a shape that facilitates the contact with the contact pad. U.S. Pat. Nos. 5,892,223 and 6,255,126 describe some examples of conventional cantilever electrical connectors. For example, the cantilever connector may include a pyramidal or similar shaped tip that is designed to facilitate electrical connection with a contact pad on the DUT by breaking through an oxide layer that may form on the contact pad. Such oxide layers reduce the conductivity through the connection, thus adversely affecting the testing of the DUT.

Conventional cantilever electrical connectors are formed from a variety of processes, such as lithographic techniques, formed (bent) wire and stamped metal. Forming tip elements/structures for cantilever electrical connectors in connection with such processes may be expensive and time consuming.

Thus, it would be desirable to provide a more easily manufactured, cost-effective, tip structure for a cantilever electrical connector.

SUMMARY OF THE INVENTION

According to an exemplary embodiment of the present invention, a probe for a probe card assembly is provided. The probe includes a beam element having a tip end portion. The probe also includes a tip structure on the tip end portion of the beam element. The tip structure includes a plurality of conductive bumps arranged in a stacked configuration.

According to another exemplary embodiment of the invention, a probe card assembly is provided. The probe card assembly includes (1) a substrate defining a surface, and (2) a plurality of probe elements supported on the surface of the substrate. Each of the probe elements includes (a) a beam element having a tip end portion, and (b) a tip structure on the tip end portion of the beam element. The tip structure includes a plurality of conductive bumps arranged in a stacked configuration.

According to yet another exemplary embodiment of the invention, a method of forming an electrical connector is provided. The method includes providing a beam element having a tip end portion. The method also includes arranging a plurality of conductive bumps in a stacked configuration on the tip end portion of the beam element to define a tip structure of the electrical connector.

BRIEF DESCRIPTION OF THE DRAWINGS

For the purpose of illustrating the invention, there are shown in the drawings a form of the invention which is presently preferred; it being understood, however, that this invention is not limited to the precise arrangements and instrumentalities shown. It is emphasized that, according to common practice, the various features of the drawing are not to scale. On the contrary, the dimensions of the various features are arbitrarily expanded or reduced for clarity. Included in the drawing are the following figures:

FIG. 4B is a schematic view of a cantilever electrical connector, including the portion illustrated in FIG. 4A, supported by a substrate according to an exemplary embodiment of the present invention;

FIGS. 5A-5C are schematic views of various steps associated with an exemplary method of processing a tip structure of a cantilever electrical connector according to an exemplary embodiment of the present invention;

DETAILED DESCRIPTION OF THE INVENTION

According to various exemplary embodiments of the present invention described herein, an efficient and inexpensive process for configuring cantilever electrical connectors is provided. The use of stacked bumps allows for a base cantilever electrical connector to be modified to suit a particular device to be tested. The use of a bonder to provide the attachment of the cantilever electrical connector to a probe card also permits automation of the probe attachment, thus reducing the labor and associated cost with the conventional method of attaching the cantilever electrical connectors by hand.

As used herein, the term "cantilever" refers to a beam member, and more particularly, to an elongated beam member supported such that an end of the beam member is unsupported to deflect under an applied load.

As used herein, the terms "probe" or "probe element" refer to any conductive structure configured for probing a conductive region of a semiconductor device (e.g., a semiconductor device prior to singulation from a wafer, a packaged semiconductor device already singulated from a wafer, etc.). Thus, the terms "probe" or "probe element" include such structures including portions having any of a number of shapes/configurations (e.g., straight beam members, bent beam members, curved members, etc.) and structures formed from any of a number of processes (e.g., plating process such as lithographic processes, subtractive processes such as etching or stamping, etc.).

Figure 1:
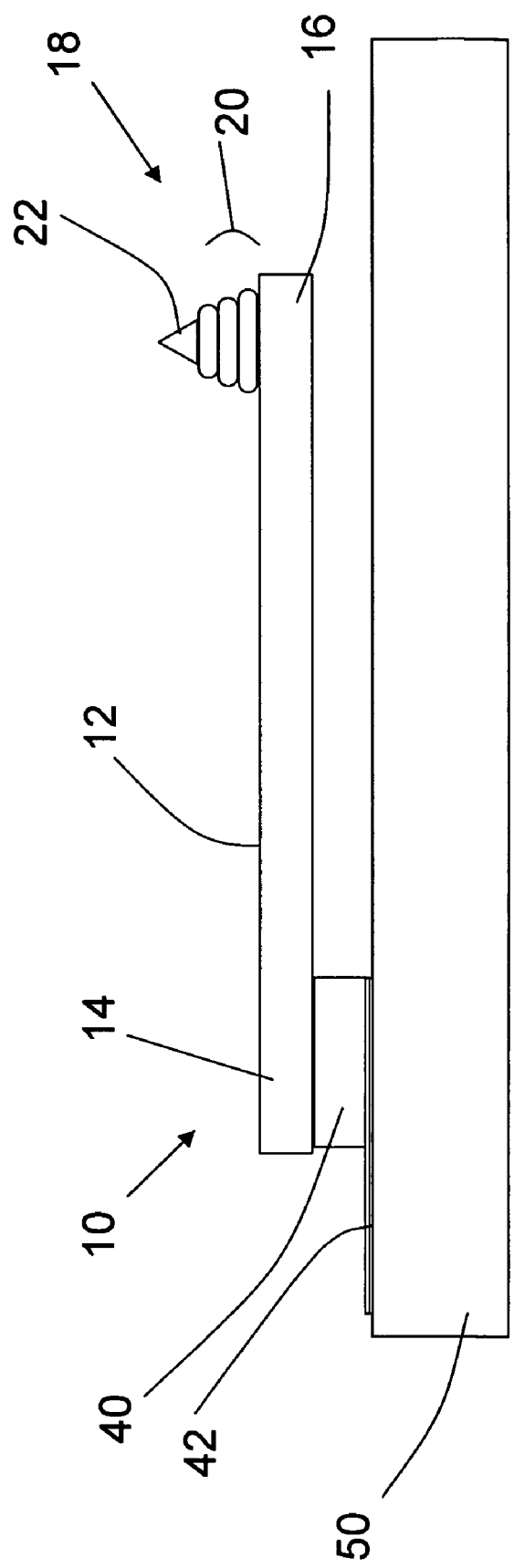
FIG. 1 is a schematic view of a cantilever electrical connector supported by a substrate according to an exemplary embodiment of the present invention.

FIG. 1 illustrates cantilever electrical connector 10 (e.g., a probe or probe element 10 configured to be part of a probe card assembly). For example, connector 10 may be configured to provide temporary electrical interconnection between a device to be tested (e.g., an integrated circuit device prior to singulation from a wafer) and a testing system via a probe card assembly. Electrical connector 10 includes beam element 12 with first end 14 and second end 16. Tip structure 18 is provided on second end 16. Exemplary tip structure 18 includes a stack of flattened or coined stud bumps 20 and a shaped bump 22 on the top of stack 20. Beam element 12 may be formed using any conventional cantilever beam forming process known to those skilled in the art, for example, additive processes (e.g., plating processes such as those using lithographic techniques) or subtractive processes (e.g., stamping, etching, laser cutting or ablation, etc.). Electrical connector 10 may be formed from any suitable material that provides good electrical conductivity and resiliency, such as, for example, gold. Alternatively, electrical connector 10 may include a core structure (e.g., a conductive or non-conductive structure) coated or plated with a conductive layer.

Electrical connector 10 is coupled at first end 14 to post 40. Post 40 is disposed on conductive region 42 of substrate 50. For example, conductive region 42 may be a conductive trace, a terminal, a contact pad, etc. of substrate 50. In the case of conductive region 42 being a conductive trace, such a trace may be deposited on substrate 50, for example, through plating techniques (e.g., photolithographic techniques). While not limited thereto, post 40 may also be a plated-up structure, (e.g., plated-up onto conductive region 42 through photolithography).

While not shown in FIG. 1 (or other figures provided herein), substrate 50 (e.g., a space transformer) includes conductive paths extending from a first surface adjacent conductive region 50 to an opposite surface of substrate 50. In a probe card assembly, such opposite surface may be positioned adjacent an interposer as shown and described with respect to FIG. 7.

Exemplary tip structure 18 is formed, for example, using a wire bonding machine such as those sold by Kulicke and Soffa Industries, Inc., Willow Grove, Pa. More particularly, referring to FIGS. 2A-2F, a wire bonder includes a bonding tool 19 (e.g., a capillary tool) used to place a first stud bump 20a on second end 16 of beam element 12 (See FIG. 2A). Because the exemplary stud bump 20a has a generally irregular shape, shaping tool 30 illustrated in FIG. 2B is used to flatten or coin stud bump 20a to have a more planar surface. In FIG. 2B, shaping tool 30 is shown moving upward and away from the flattened stud bump 20a. While a distinct tool 30 is illustrated in FIG. 2B to flatten stud bump 20a, it is contemplated that a tool integrated into bonding tool 19 (e.g., a flat surface of bonding tool 19) may be used to flatten stud bumps such as stud bump 20a.

Figure 2C:
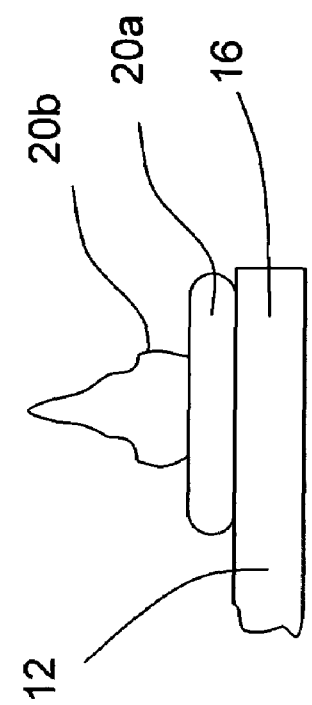
FIGS. 2A-2F are schematic views of various steps associated with an exemplary method of forming the cantilever electrical connector of FIG. 1.
Figure 2A:
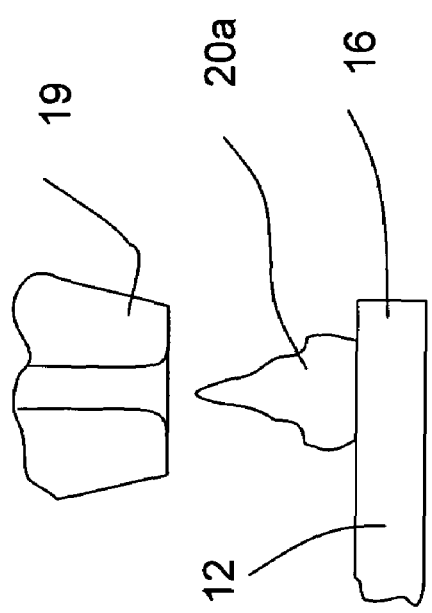
Figure 2B:
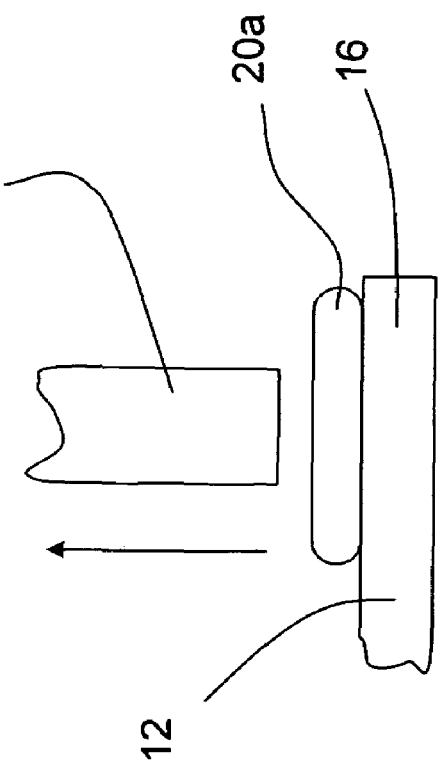

Wire bonding tool 19 then places second stud bump 20b on top of the flattened stud bump 20a as shown in FIG. 2C. Shaping tool 30 is used to flatten second stud bump 20b to the shape illustrated in FIG. 2D, and the process is repeated until the desired number of flattened bumps (to achieve a desired tip height) are obtained. As shown in FIG. 2D, third stud bump 20c has been bonded to flattened bump 20b. As shown in FIG. 2E, third bump 20c has been flattened and is shown as part of stack 20, while top bump 22 is bonded on top of third bump 20c. In the exemplary embodiment illustrated in FIGS. 2A-2F, the stack of bumps 20 (i.e., bumps 20a, 20b, and 20c) have different sizes such that a tapered (e.g., pyramidal or triangular) shaped tip structure is achieved.

Figure 2F:
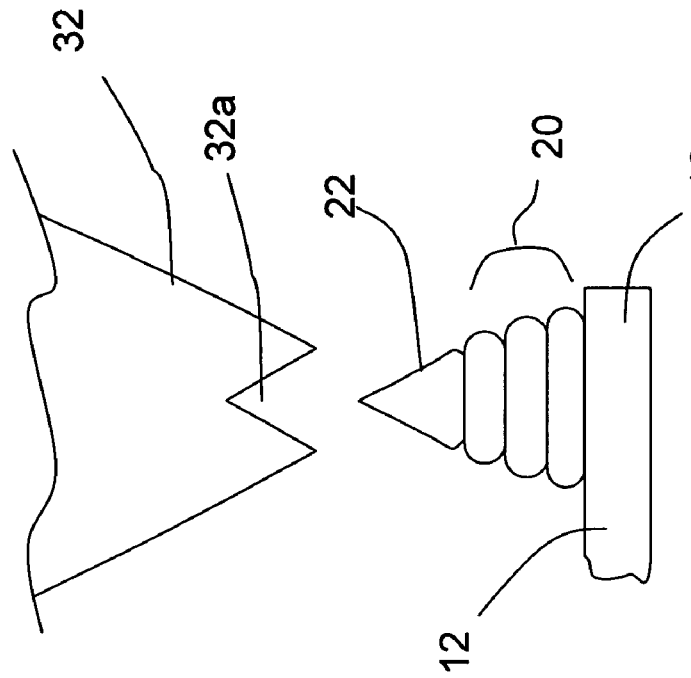
Figure 2D:
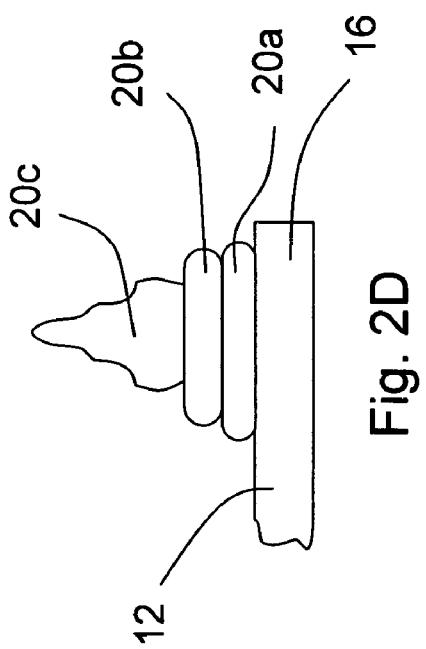
Figure 2E:
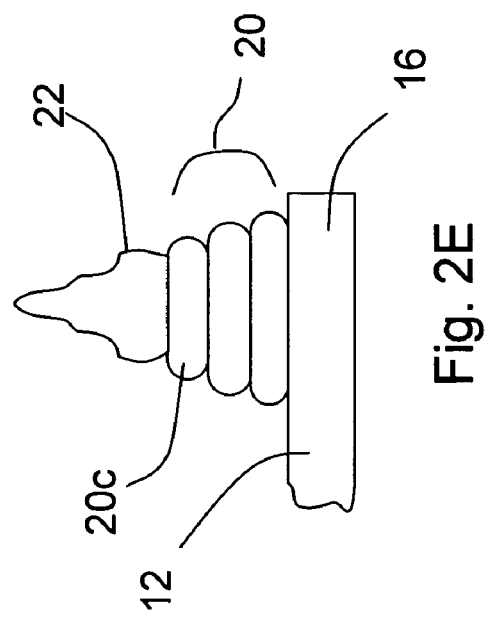

As shown in FIG. 2F, shaping tool 32 is used to form the top bump 22 into a desired shape. The desired shape may be any of a number of shapes, such as conical, pyramidal (e.g., three-sided pyramidal, four sided pyramidal), hemispherical, etc. As is clear from FIG. 2F, shaping tool 32 includes a mold recess 32a used to form the desired tip shape.

Figure 3:
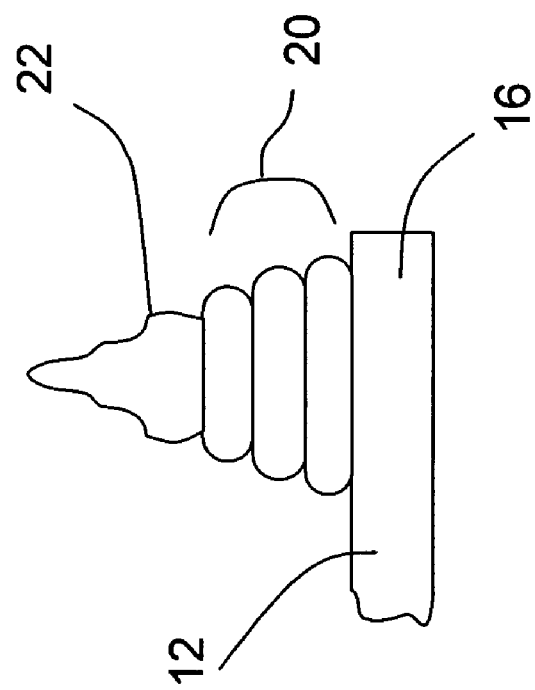
FIG. 3 is a schematic view of a portion of a cantilever electrical connector according to an exemplary embodiment of the present invention.

While FIG. 2F illustrates a shaped bump 22, the present invention is not limited to embodiments having the top bump shaped using a shaping tool. For example, FIG. 3 illustrates a final tip structure having a stack of bumps 20 and bump 22 which is the shape of the bump as it exists after deposition from bonding tool 19. Bump 22 in FIG. 3 is not shaped because it is deposited by bonding tool 19 in a desirable shape for its intended purpose, that is, to be the final portion of a tip structure of a cantilever probe element of a probe card assembly.

Figure 4A:
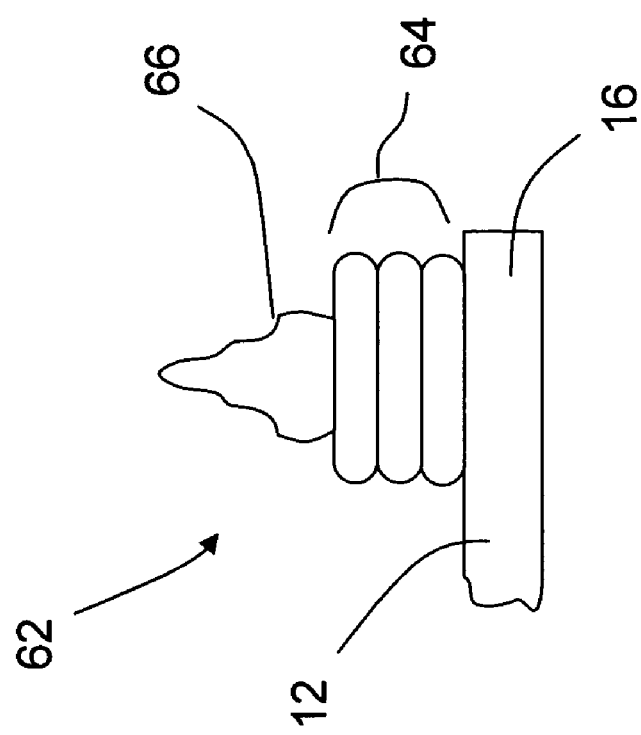
FIG. 4A is a schematic view of a portion of another cantilever electrical connector according to an exemplary embodiment of the present invention.

While the exemplary embodiments of the present invention illustrated in FIGS. 1-3 include a stack of bumps having different sizes to form a generally pyramidal or conical tip structure 18, the present invention is not limited thereto. For example, as shown in FIG. 4A, a tip structure 62 may include a stack 64 of flattened or coined stud bumps of substantially uniform size with a final bump 66 (which may be shaped or not shaped as with bump 22 described above) bonded thereto. FIG. 4B illustrates an electrical connector 60 (e.g., a cantilever probe element of a probe card assembly) supported by a substrate 50. Electrical connector 60 includes post 40 electrically coupled to conductive region 42 on substrate 50. Electrical connector 60 also includes beam element 12 electrically coupled (e.g., TAB bonded) to post 40, and tip structure 62 as shown in FIG. 4A.

Each of the bumps (e.g., bumps in stack 20 or in stack 64) may be formed from the same or different electrically conductive materials. In one example, the bumps are formed from a platinum iridium alloy (i.e., a PtIr alloy). Other exemplary materials used to form the bumps include gold, copper, platinum, palladium, silver, or alloy combinations thereof. In certain exemplary embodiments of the present invention, a material with good malleability characteristics is desirable. Further, the top bump (e.g., bump 22, bump 66) may be formed from a material that has sufficient hardness to break through an oxide layer that may form on a typical contact pad on a device to be tested. Examples of suitable metals that can be used as the top bump are palladium, platinum-iridium, Paliney-7, and palladium-cobalt.

In forming a stack of bumps along with a tip, such as stack 20 and tip 22 illustrated in FIG. 1, it is noteworthy that certain bump materials (e.g., PtIr bumps) do not adhere well to themselves in the bumping process. In such an event, an adhesion material (e.g., a thin layer of gold) may be applied (e.g., sputtered) on each bump for adherence of the next bump.

While the present invention is not limited to bumps of any particular size, exemplary bumps in a stack (after flattening/coining) may be 50 to 60 µm in diameter and approximately 20 to 25 µm thick. An exemplary top bump (e.g., bump 22 of FIG. 1) may be shaped such that the tip of the bump is less than or equal to 50 µm in diameter and approximately 25 µm tall. An exemplary stack height (from the top of the beam to the top of the stack tip) is 100 µm. Of course these dimensions are exemplary in nature, and alternative dimensions are contemplated (e.g., smaller dimensions for fine pitch applications).

The bumps of the tip structures according to the present invention (e.g., bumps 20, 22 of FIG. 1) may be adhered to the beam member and of the electrical connector, and flattened or shaped, using any conventional manner. As provided above, the bumps may be adhered to the beam member (and to each other in a stacked configuration) using conventional ball/bump bonding techniques (e.g., ultrasonic, thermosonic, thermocompressive, etc.). In certain exemplary embodiments of the present invention, the beam member (e.g., beam member 12 of FIG. 1) may be heated during the process of bonding the bumps. Further, if certain materials are used to form the bumps (e.g., copper or copper alloys), the bumping application may desirably be performed in a non-oxidizing atmosphere.

After a beam element of an electrical connector (e.g., beam 12 of electrical connector 10 of FIG. 1) is formed according to the present invention (including the applications of the bumps as a tip structure), the beam element may be attached to a component of the testing apparatus, such as the probe card. The attachment can be through many different methods known to those skilled in the art. An exemplary attachment is through the use of a tab bonding process. Tab bonding processes are well known in the art and utilize a bonder as a spot welder. For example, the bonder may be used to attach the beam element to a post on a substrate, as described above with respect to FIG. 1. While the beam element is described as being coupled to a post element after the stacked bumps are applied thereto, in certain embodiments of the present invention, one or more of the bumps are attached to the beam element after the beam is coupled to a post on the substrate.

According to certain exemplary embodiments of the present invention, it may be desirable to alter the heights of stacks of bumps of a plurality of electrical connectors such that the heights are more uniform. Further, it may be desirable to partially flatten/coin the tip of each bump stack to provide a more reliable break-in period for the tip structure. These optional features of the present invention are illustrated in, and described below with respect to, FIGS. 5A-5C and 6A-6C.

Referring now to FIG. 5A, a flat surface of bonding tool 500 descends to the very top of bump 66 of tip structure 62. Bonding tool 500 may partially flatten the top of bump 66, or alternatively, bonding tool 500 may just contact the top of bump 66 with no intended flattening of bump 66. Regardless, a first reference height $h_1$ is measured at this height as shown in FIG. 1. If bonding tool 500 does partially flatten the top of bump 66, height $h_1$ is measured at the reduced height based on the flattening. A feedback system may be included to control the height and/or other parameters such as the diameter of the flattened tip.

Referring now to FIG. 5B, bonding tool 500 (also referred to here as adjustment tool 500) descends to a second reference point $h_2$, which, in the exemplary embodiment shown in FIG. 5B is the top surface of beam element 12. With the two reference heights (e.g., $h_1$ and $h_2$), a relative height may be determined. If the relative height of the stack (including the top bump) is higher than a desired stack height an adjustment to the stack height may be performed, preferably without affecting the tip feature. As shown in FIG. 5C, adjustment tool 500 descends with its aperture/hole centered over a center of bump stack (i.e., tip structure 62). Once contact is detected between adjustment tool 500 and the bump stack (e.g., based on machine feedback), a downward force equal approximately to the yield force of the bump stack is applied for a period of time allowing for stabilization of the position of adjustment tool 500. The position of adjustment tool 500 is referenced and an increasing downward force (e.g., including ultrasonic energy) is applied to adjustment tool 500 until a desired descent is achieved which will result in the bump stack reaching a desired predetermined height $h_3$ (or until a specified timeout occurs).

Figure 6A:
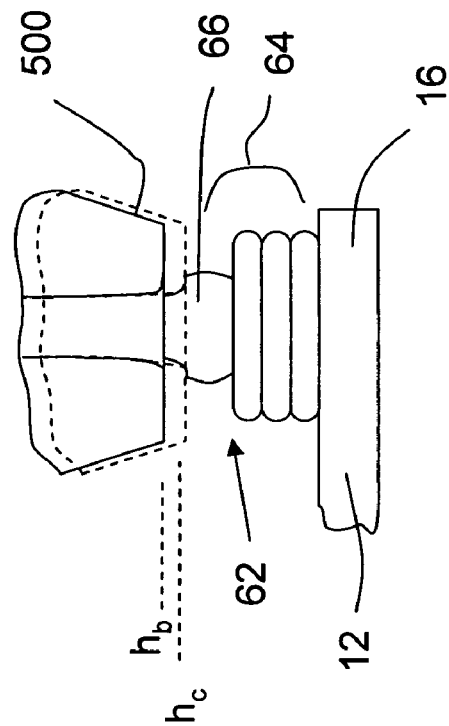
FIGS. 6A-6C are schematic views of various steps associated with another exemplary method of processing a tip structure of a cantilever electrical connector according to an exemplary embodiment of the present invention.
Figure 6B:
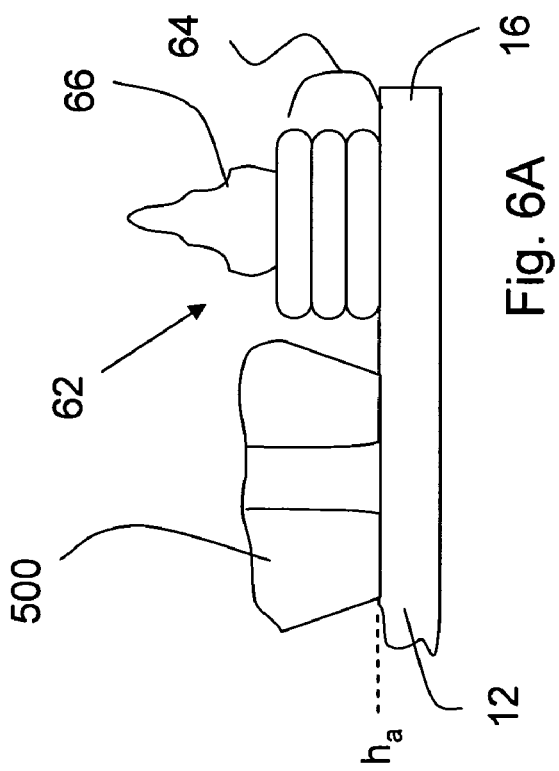
Figure 6C:
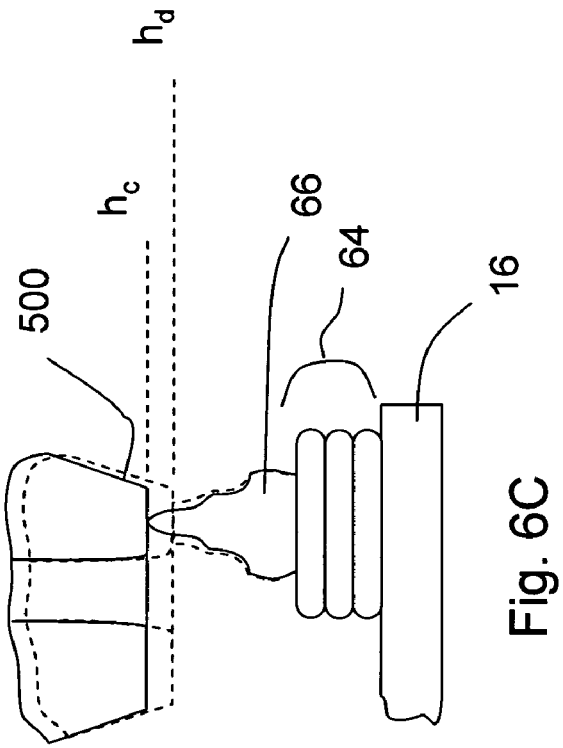

A slightly different approach is illustrated with respect to FIGS. 6A-6C. In FIG. 6A, adjustment tool 500 measures a first reference height $h_a$ at the surface of beam element 12. In FIG. 6B, adjustment tool 500 changes the height of tip structure 62 by descending from an initial height $h_b$ of initial contact (initial contact between adjustment tool 500 and tip structure 62) to a desired varied height $h_c$ (e.g., using a process similar to that described above with respect to FIG. 5C), where heights $h_b$ and $h_c$ are taken by reference to height $h_a$. In FIG. 6C, if it is desired, the top of bump 66 may be flattened/coined by lowering adjustment tool 500 from reference height $h_c$ to new height hd (e.g., using a flat surface of adjustment tool 500).

The adjustment processes illustrated and described with respect to FIGS. 5A-5C and FIGS. 6A-6C are exemplary in nature, and variations and different methods are contemplated.

Although the adjustment tool 500 illustrated in FIGS. 5A-5C and 6A-6C is a wire bonding tool (e.g., a capillary tool), other adjustment tools are contemplated.

In each of FIGS. 1 and 4B, only one electrical connector (e.g., a cantilever probe), respectively 10, 60, is shown. It should be understood, however, that probe card assemblies respectively incorporating probes 10, 60 (and other probes within the scope of the present invention) would each include multiple probes mounted to a substrate (e.g., a space transformer).

Figure 7:
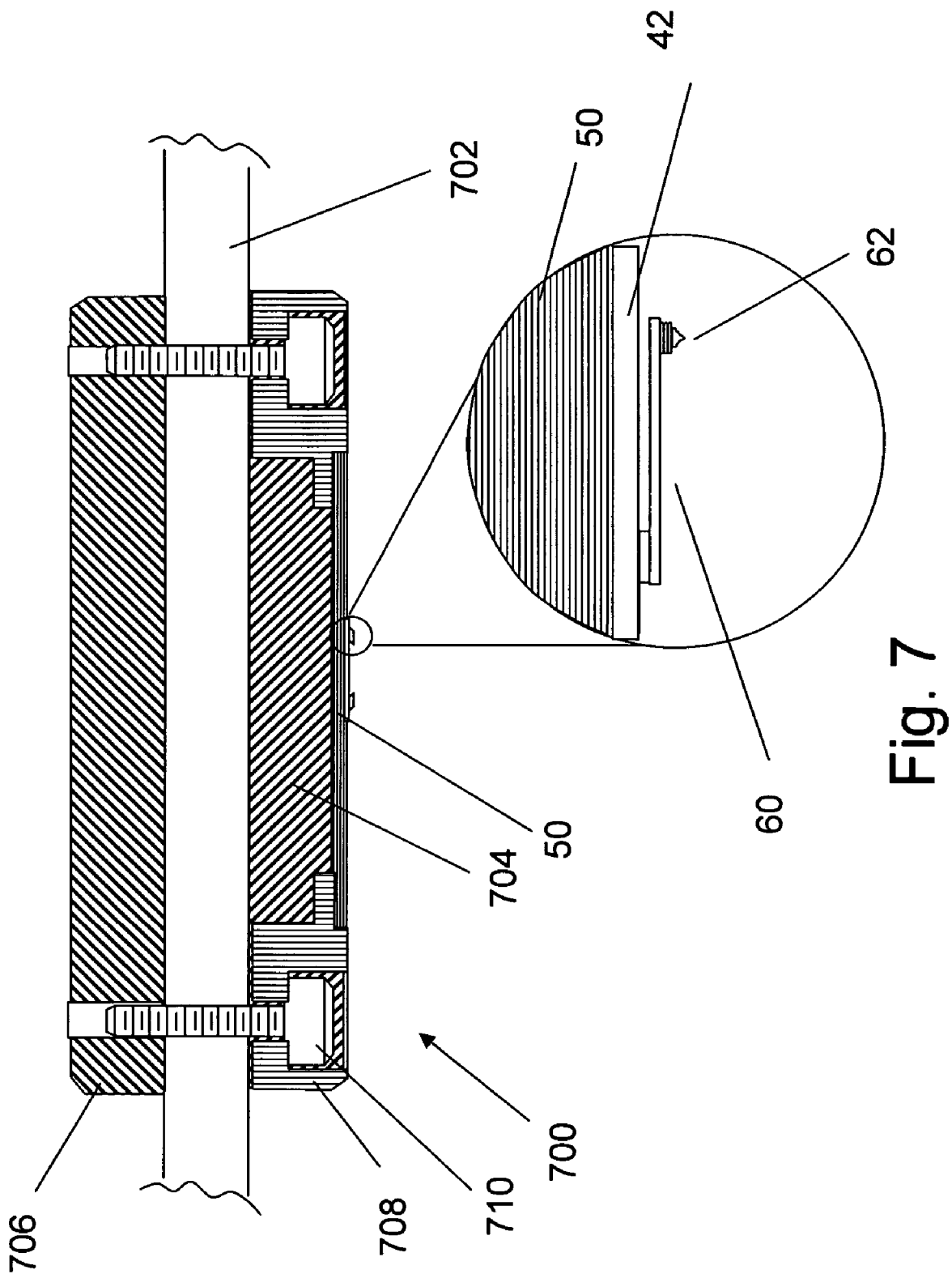
FIG. 7 is a cut away view of a portion of a probe card assembly including a detailed view of a cantilever electrical connector according to an exemplary embodiment of the present invention.

Referring now to FIG. 7, there is illustrated a portion of a probe card assembly 700 including two rows of probes 60 (as configured for certain memory devices) according to an exemplary embodiment of the invention, where the exemplary probes shown are the electrical connector 60 illustrated in FIG. 4B. Probe card assembly 700 includes PCB 702, substrate 50 (e.g., a space transformer 50 such as an MLO or MLC space transformer), and interposer 704 (e.g., a spring pin or pogo pin based interposer) disposed between PCB 702 and substrate 50, as is known to those skilled in the art. Exemplary probe card assembly 700 also includes stiffener elements 706 and 708, as well as fasteners 710.

A detailed view of an exemplary probe 60 coupled to substrate 50 through conductive trace 42 according to an exemplary embodiment of the present invention is also shown in FIG. 7. Any other probe or electrical connector within the scope of the present invention may also be included as part of a probe card assembly, such as that shown in FIG. 7.

While an exemplary configuration of a probe card assembly is shown in FIG. 7, the present invention is not limited thereto. Various probe card configurations as are known to those skilled in the art are contemplated.

Figure 8:
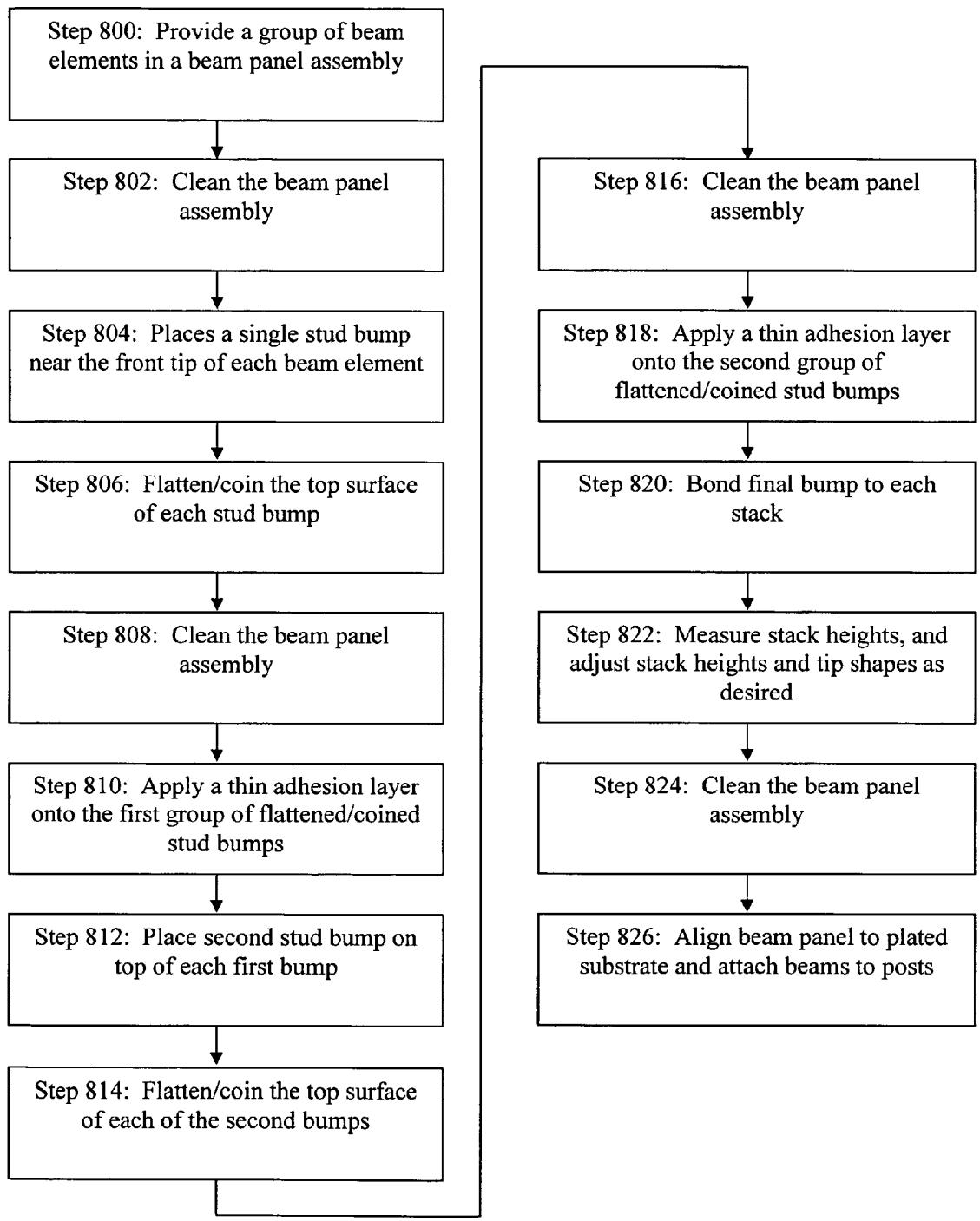
FIG. 8 is a flow diagram illustrating a method of processing a probe card including cantilever electrical connectors according to an exemplary embodiment of the present invention.

FIG. 8 illustrates an exemplary process for processing a probe card including cantilever electrical connectors. Various of the steps illustrated in FIG. 8 may be altered or omitted within the scope of the present invention. At step 800, a group of beam elements in a beam panel assembly (e.g., a plated panel of beam elements connected by tie bars) is provided. At step 802, the beam panel assembly is cleaned (e.g., via a plasma cleaner) to remove contaminants from the beam panel surface. After cleaning, the beam panel assembly is moved to a wire bonder. At step 804, using a bonding tool, the wire bonder places a single stud bump (e.g., a stud bump of PtIr wire, palladium alloy wire, etc.) near the front tip of each beam element. After the bumps are placed on the beam tips, the beam assembly is moved to a second wire bonder. At step 806, the top surface of each stud bump is flattened/coined using a tool of the second wire bonder. Of course, steps 804 and 806 could be accomplished using a single wire bonder. Further, systems other than a wire bonder may be employed to flatten/coin the stud bumps at step 806.

At step 808 the beam panel assembly (including the first group of flattened/coined stud bumps) is cleaned (e.g., via a plasma cleaner). At step 810, after cleaning, a thin adhesion layer (e.g., a thin layer of gold) is applied (e.g., sputtered) onto the first group of flattened/coined stud bumps. At step 812, the beam panel assembly is then moved to the first wire bonder and a second stud bump is placed on top of the first bump, and at step 814, the second bumps are flattened/coined (e.g., at the first wire bonder or at a second wire bonder).

At step 816, the beam panel assembly is then cleaned (e.g., via a plasma cleaner), and, at step 818, an adhesion layer (a thin layer of sputtered gold) is applied to the second bumps. This process (e.g., bumping, coining, cleaning and applying an adhesion layer) is repeated as desired to reach a desired stack height. At step 820, a final bump is bonded to the stack, and if desired, the final bump may be shaped (e.g., as in FIG. 2F).

After all the stacks are complete including final bumps (shaped or not shaped), the assembly is placed back onto a wire bonder (e.g., the first wire bonder). Further, the stacks including the final bumps may undergo an annealing process to improve adhesion (e.g., between the conductive bumps, between the stack and the beam, etc.). At step 822, the wire bonder measures the height of each stack and then adjusts (1) the individual stacks down to a desired height and/or (2) adjusts the tip shape (e.g., the diameter of the tip). Step 822 may be conducted, for example, according to one of the exemplary processes described above with reference to FIGS. 5A-5C or 6A-6C.

At step 824, after the adjustment process, the beam panel is cleaned (via a plasma cleaner). At step 826, the beam panel is aligned to a plated substrate including elevated posts corresponding to each beam, and the beams are attached to the posts (e.g., using a TAB bonding process), after which the individual beams are separated from the beam panel.

Although the present invention has been described primarily with respect to techniques using a wire bonder, it is not limited thereto. Various processes and structures disclosed herein (e.g., layered tip structures on a beam, coining processes, etc.) may be accomplished using systems other than wire bonding systems.

While the present invention has been described primarily with respect to probes for a probe card assembly for wafer testing, it is contemplated that certain of the concepts disclosed herein may be applied to other testing technologies such as package testing of packaged integrated circuits.

The elements (e.g., posts, beams, etc.) of electrical connectors (e.g., cantilever probe elements) included in the various exemplary probes of the present invention may include conductive materials which may not have a desired property such as conductivity, adhesiveness during bonding, or hardness. Thus, while not explicitly described in connection with each illustrated embodiment herein, it is clear that certain of the elements may be coated, plated, or sputtered as desired to provide such property. For example, when coupling (1) a beam of an electrical connector to (2) a post of an electrical connector using certain bonding techniques (e.g., TAB bonding), it may be desirable to sputter a malleable material on the post prior to bonding the beam thereto. As a more specific example, if a post and a beam are formed of nickel manganese, it may be desirable to sputter gold onto the post prior to bonding the beam thereto to provide a more robust bond.

While the present invention has been described primarily with respect to stud bumped stacked tip elements, it is not limited thereto. Other conductive bumps are contemplated to form the stacked tip elements.

The present invention may be embodied in other specific forms without departing from the spirit or essential attributes thereof. Although the invention has been described and illustrated with respect to the exemplary embodiment thereof, it should be understood by those skilled in the art that the foregoing and various other changes, omissions and additions may be made therein and thereto, without parting from the spirit and scope of the present invention.

What is claimed is:

1. A probe for a probe card assembly comprising:
   a beam element having a first end and a second end;
   a tip structure on the second end of the beam element, the tip structure including a plurality of flattened conductive bumps arranged in a stacked configuration;
   a post structure securing the first end of the beam element to a substrate, wherein the post structure secures the first end of the beam element and allows a remaining portion of the beam element from the first end to the second end of the beam element to deflect in response to the tip structure making contact with a device to be tested; and
   adhesive material comprising a layer of gold disposed between at least two adjacent flattened conductive bumps from the plurality of flattened conductive bumps, wherein the layer of gold is in contact with each of the at least two adjacent flattened conductive bumps.

2. The probe according to claim 1, wherein the plurality of flattened conductive bumps includes a top bump positioned on the at least two flattened conductive bumps.

3. The probe according to claim 2, wherein the top bump has a shape defined substantially by an interior surface of a bonding tool that defines an aperture of the bonding tool.

4. The probe according to claim 2, wherein the top bump has a shape selected from the group consisting of substantially pyramidal, substantially conical, or substantially hemispherical.

5. The probe according to claim 1, wherein at least two flattened conductive bumps from the plurality of flattened conductive bumps have different diameters such that the tip structure defines a tapered shape.

6. The probe according to claim 1, wherein at least two flattened conductive bumps from the plurality of flattened conductive bumps have substantially similar diameters.

7. A probe card assembly comprising:
a substrate defining a surface; and
a plurality of probe elements supported on the surface of the substrate, each of the probe elements including:
a beam element having a first end and a second end,
a tip structure on the second end of the beam element, the tip structure including a plurality of flattened conductive bumps arranged in a stacked configuration,
a post structure securing the first end of the beam element to the substrate, wherein the post structure secures the first end of the beam element and allows a remaining portion of the beam element from the first end to the second end of the beam element to deflect in response to the tip structure making contact with a device to be tested; and
adhesive material comprising a layer of gold disposed between at least two adjacent flattened conductive bumps from the plurality of flattened conductive bumps, wherein the layer of gold is in contact with each of the at least two adjacent flattened conductive bumps.

8. The probe card assembly according to claim 7, wherein the plurality of flattened conductive bumps includes a top bump positioned on the at least two flattened conductive bumps.

9. The probe card assembly according to claim 8, wherein the top bump has a shape defined substantially by an interior surface of a bonding tool that defines an aperture of the bonding tool.

10. The probe card assembly according to claim 8, wherein the top bump has a shape selected from the group consisting of substantially pyramidal, substantially conical, or substantially hemispherical.

11. The probe card assembly according to claim 7, wherein at least two flattened conductive bumps from the plurality of flattened conductive bumps have different diameters such that the tip structure defines a tapered shape.

12. The probe card assembly according to claim 7, wherein at least two flattened conductive bumps from the plurality of flattened conductive bumps have substantially similar diameters.

* * * * *